(12) United States Patent
Horak et al.

(10) Patent No.: US 8,404,582 B2
(45) Date of Patent: Mar. 26, 2013

(54) STRUCTURE AND METHOD FOR MANUFACTURING INTERCONNECT STRUCTURES HAVING SELF-ALIGNED DIELECTRIC CAPS

(75) Inventors: David V Horak, Albany, NY (US); Takeshi Nogami, Albany, NY (US); Shom Ponoth, Albany, NY (US); Chih-Chao Yang, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 360 days.

(21) Appl. No.: 12/773,306

(22) Filed: May 4, 2010

(65) Prior Publication Data

US 2011/0272812 A1 Nov. 10, 2011

(51) Int. Cl.
*H01L 21/4763* (2006.01)
*H01L 23/48* (2006.01)

(52) U.S. Cl. ............ 438/641; 257/750; 257/E21.583; 257/E23.142

(58) Field of Classification Search ......... 257/E21.584, 257/E23.142, 750, E21.583; 438/773, 634, 438/641, 759
See application file for complete search history.

(56) References Cited

U.S. PATENT DOCUMENTS

| | | | |
|---|---|---|---|
| 4,206,254 A * | 6/1980 | Schmeckenbecher | 427/96.8 |
| 6,153,901 A * | 11/2000 | Higashi | 257/301 |
| 6,169,010 B1 * | 1/2001 | Higashi | 438/396 |
| 6,611,060 B1 | 8/2003 | Toyoda et al. | |
| 6,975,032 B2 * | 12/2005 | Chen et al. | 257/750 |
| 7,041,574 B2 | 5/2006 | Kim et al. | |
| 7,190,079 B2 | 3/2007 | Andricacos et al. | |
| 7,250,681 B2 | 7/2007 | Matsunaga | |
| 7,422,983 B2 | 9/2008 | Cotte et al. | |
| 7,468,320 B2 | 12/2008 | Hu et al. | |
| 7,538,434 B2 | 5/2009 | Shih et al. | |
| 7,622,391 B2 * | 11/2009 | Frohberg et al. | 438/702 |
| 7,795,736 B2 * | 9/2010 | Sir et al. | 257/758 |
| 2001/0053605 A1 * | 12/2001 | Phaneuf et al. | 438/689 |
| 2004/0137721 A1 | 7/2004 | Lim et al. | |
| 2005/0082678 A1 | 4/2005 | Barth | |
| 2005/0104216 A1 | 5/2005 | Cabral, Jr. et al. | |
| 2006/0261434 A1 * | 11/2006 | Lazovsky et al. | 257/499 |
| 2007/0020918 A1 * | 1/2007 | Hirokawa et al. | 438/626 |
| 2007/0093060 A1 * | 4/2007 | Tonegawa | 438/687 |
| 2008/0012142 A1 * | 1/2008 | Mehta et al. | 257/762 |
| 2008/0061438 A1 * | 3/2008 | Hong | 257/751 |
| 2008/0280449 A1 | 11/2008 | Chang et al. | |
| 2009/0039474 A1 * | 2/2009 | Tada et al. | 257/632 |
| 2009/0051033 A1 * | 2/2009 | Gosset et al. | 257/751 |
| 2010/0013098 A1 | 1/2010 | Besling | |

OTHER PUBLICATIONS

International Search Report dated Nov. 21, 2011, application No. PCT/US2011/029127.

* cited by examiner

*Primary Examiner* — Caridad Everhart
(74) *Attorney, Agent, or Firm* — Joseph Petrokaitis; Matthew C. Zehrer

(57) ABSTRACT

Interconnect structures having self-aligned dielectric caps are provided. At least one metallization level is formed on a substrate. A dielectric cap is selectively deposited on the metallization level.

13 Claims, 6 Drawing Sheets

US 8,404,582 B2

STRUCTURE AND METHOD FOR MANUFACTURING INTERCONNECT STRUCTURES HAVING SELF-ALIGNED DIELECTRIC CAPS

BACKGROUND OF THE INVENTION

The present invention relates generally to the manufacture of interconnect structures, and more particularly to the formation of self-aligned dielectric caps on copper interconnects.

Dielectric caps are employed in copper interconnects to act as a copper diffusion barrier. Dielectric caps may also act as an oxygen diffusion barrier to prevent oxidation of copper. Dielectric caps ensure good electromigration performance; however, the dielectric constant of conventionally used dielectric caps such as silicon carbide (SiC) and silicon carbon nitride (SiCN) is high (e.g., 5-7). The dielectric cap substantially contributes to Resistive Capacitive (RC) delay. It is desired to have a self-aligned dielectric cap for capacitance reduction and performance improvement.

SUMMARY OF THE INVENTION

In a first aspect of the invention, a method of forming a device includes providing a substrate. The method further includes forming at least one metallization level on the substrate. The method also includes selectively depositing a dielectric cap on the metallization level.

In a second aspect of the invention, a method of forming a device includes providing a substrate. The method includes forming a first ILD layer above the substrate, wherein the first ILD layer has a top surface and a first opening. The method includes depositing a first metal liner in the first opening. The method includes forming a first metallization level in the first opening. The method includes forming a first cap layer on the top surface of the first ILD layer. The method includes forming a second ILD layer above the first cap layer, wherein the second ILD layer has a top surface and a second opening extending into the first metallization level. The method includes depositing a second metal liner on the top surface and in the second opening. The method includes forming a second metallization level in the second opening. The method includes performing a CMP of the second metallization level, wherein a top of the second metallization level is co-planar with a top of the second metal liner. The method further includes forming a second cap layer on the second metallization level. The method also includes removing the second metal liner from the top surface of the second ILD layer.

In a further aspect of the invention, a device includes a substrate. The device further includes at least one metallization level on the substrate. The device also includes a dielectric cap selectively deposited on the metallization level.

In a yet further aspect of the invention, a device includes a substrate. The device includes a first ILD layer formed above the substrate, wherein the first ILD layer has a top surface and a first opening. The device includes a first metal liner deposited in the first opening. The device includes a first metallization level formed in the first opening. The device includes a first cap layer formed on the top surface of the first ILD layer. The device includes a second ILD layer formed above the first cap layer, wherein the second ILD layer has a top surface and a second opening extending into the first metallization level. The device includes a second metal liner deposited in the second opening. The device further includes a second metallization level formed in the second opening, wherein the second metallization level is coplanar with the top surface of the second ILD layer. The device also includes a second cap layer formed on the second metallization level.

BRIEF DESCRIPTION OF THE DRAWINGS

The present invention is described in the detailed description below, in reference to the accompanying drawings that depict non-limiting examples of exemplary embodiments of the present invention.

DETAILED DESCRIPTION OF THE INVENTION

Figure 1:
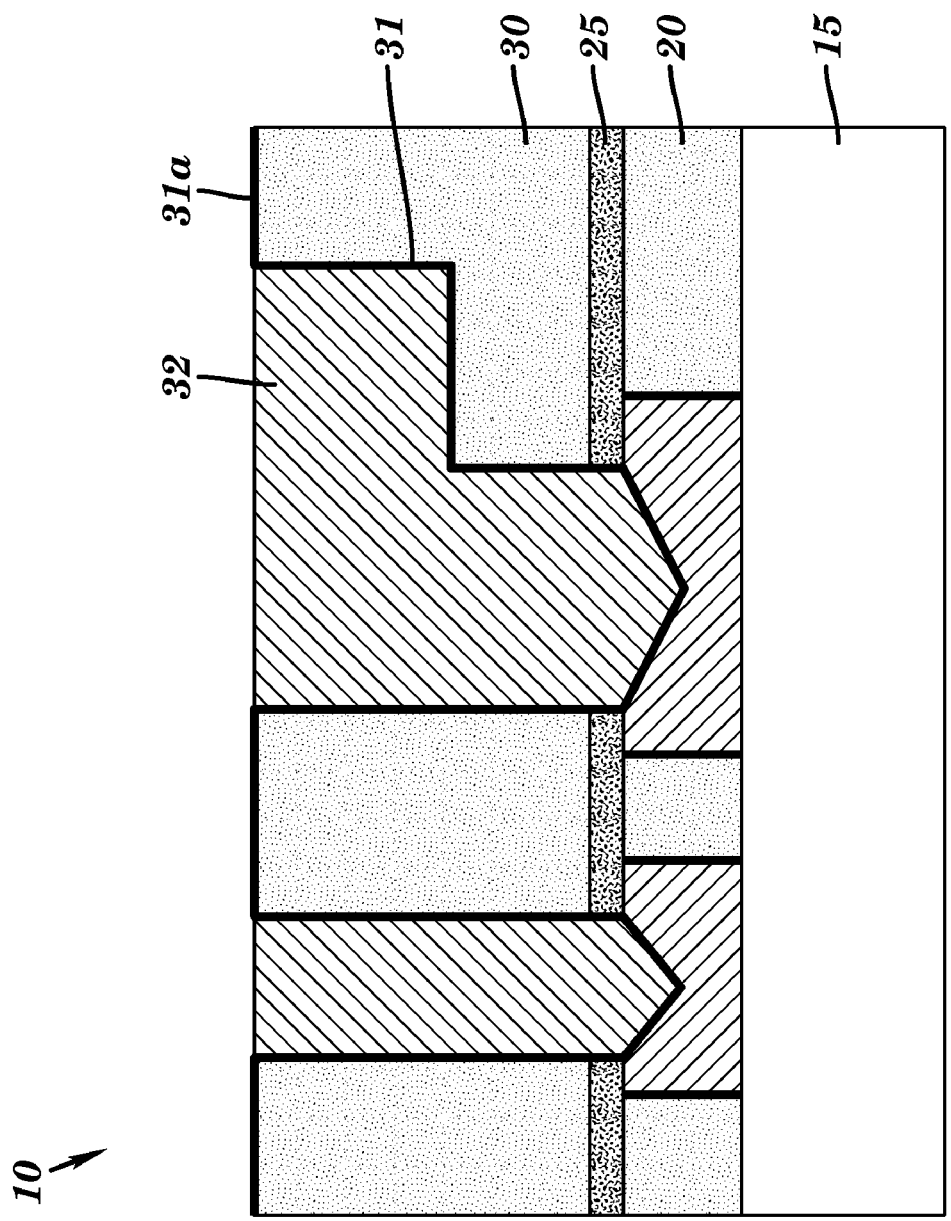
FIG. 1 shows a starting interconnect structure in accordance with an embodiment of the invention.

FIG. 1 shows a starting interconnect structure 10 in accordance with an embodiment of the invention. Interconnect structure 10 may be formed on a substrate 15 using conventional processes. Interconnect structure 10 may include an underlying metallization or device level 20, a cap layer 25, an interlevel dielectric layer (ILD) 30, a metal liner 31 and a copper metallization level 32. Underlying metallization level 20 may include, but is not limited to copper (Cu), aluminum (Al), tungsten (W) and other low resistivity semiconductor compatible metals. Cap layer 25 may include, but is not limited to silicon carbon nitride (SiCN), silicon nitride (SiN) and silicon carbide (SiC). ILD 30 may include, but is not limited to: carbon doped silicon oxide (SiCOH), porous SiCOH and silicon oxide (SiO). Metal liner 31 may include, but is not limited to a stack of tantalum nitride (TaN) and tantalum (Ta). Chemical mechanical planarization (CMP) is performed to remove copper, stopping on field liner regions. Liner 31a is retained in the field regions. Liner 31a is not polished. CMP is stopped before the liner polish.

Figure 2:
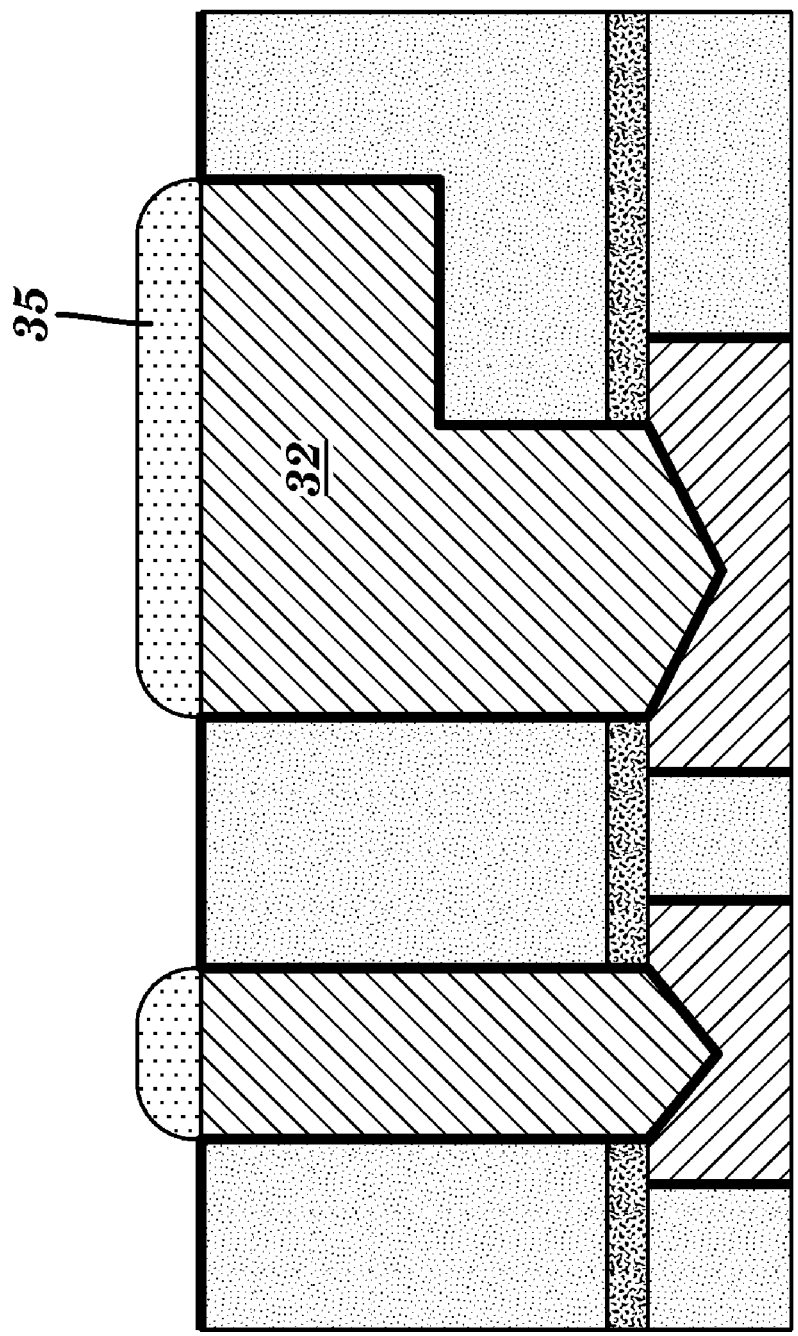
FIG. 2 shows processing steps and an intermediate interconnect structure in accordance with an embodiment of the invention.

Referring to FIG. 2, dielectric cap 35 may be selectively deposited on copper metallization level 32. It was discovered that plasma enhanced chemical vapor deposition (PECVD) silicon carbon nitride (SiCN), such as nBLoK has selective properties. It was observed that nBLoK does not deposit much on TaN and/or Ta. Due to the selective nature of the dielectric cap deposition, nBLoK deposits only on copper metallization level 32 and does not deposit on liner 31a. Other dielectric cap materials such as SiN and SiC, deposited by PECVD, chemical vapor deposition (CVD) or atomic layer deposition (ALD) or any known or later developed processes may be tuned to have this selective deposition property. Dielectric cap 35 may be approximately 5 nm to 100 nm thick.

Figure 3:
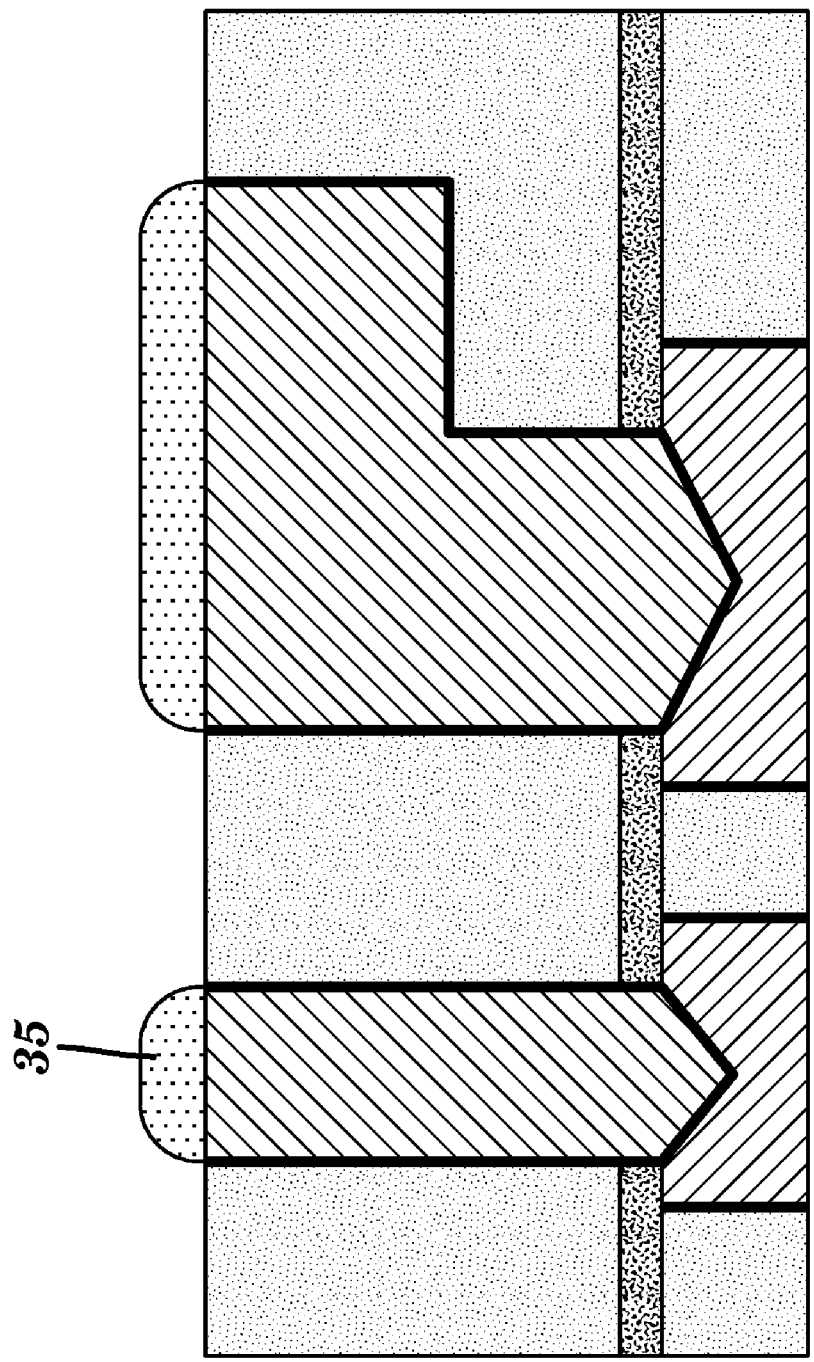
FIG. 3 shows processing steps and a final interconnect structure in accordance with an embodiment of the invention.

Referring to FIG. 3, liner 31a is etched back and removed in the field regions. Low bias fluorine containing plasmas or any known or later developed processes may be used. Liner 31a may be removed using a fluorine based chemistry, such as a carbon tetra fluoride (CF4) reactive ion etch (RIE). This chemistry may also remove some of dielectric cap 35. This may be factored into the initial deposited thickness of dielectric cap 35. Liner 31a may also be removed using a xenon fluoride (XeF) gas. XeF gas removes liner 31a selectively to dielectric cap 35. The next level ILD may be subsequently deposited and the build continued using conventional processes.

Figure 4:
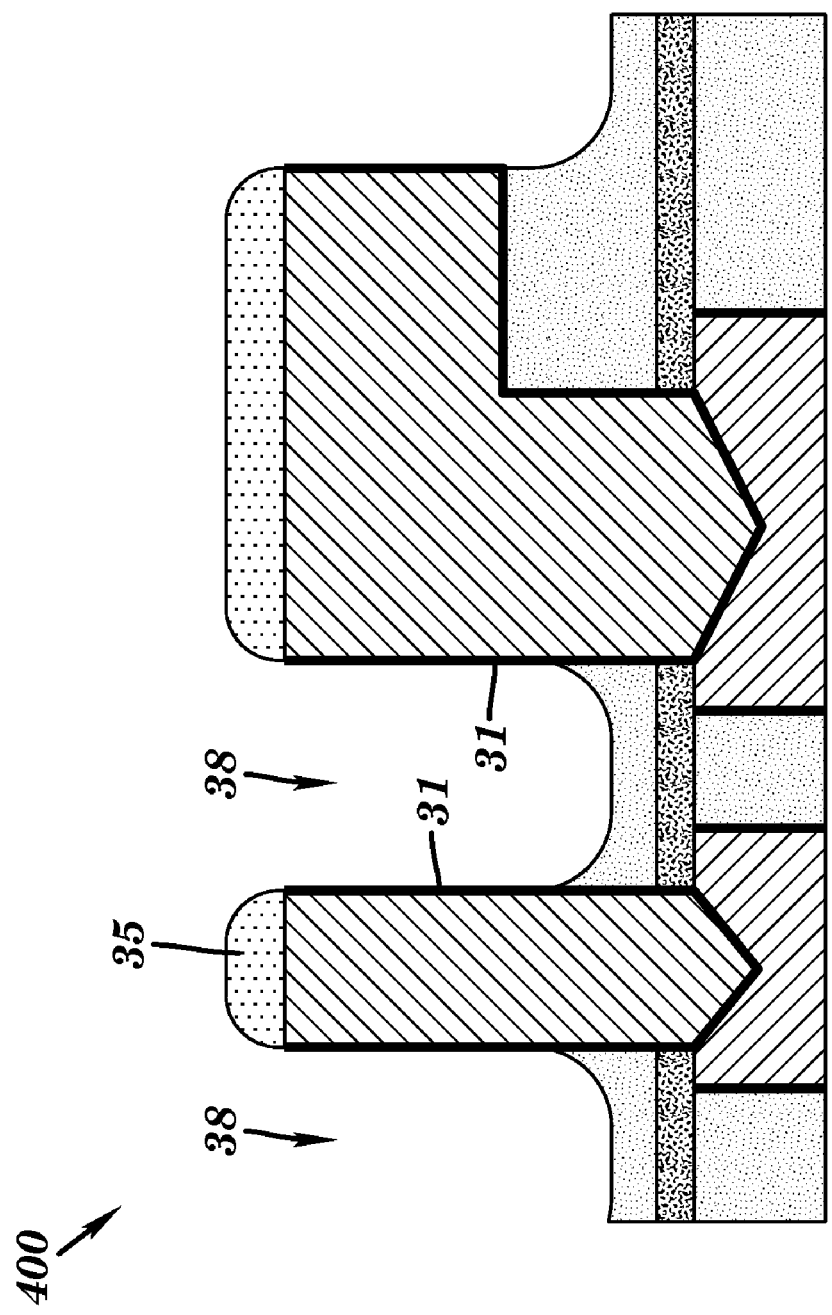
FIG. 4 shows a final interconnect structure in accordance with a second embodiment of the invention.

FIG. 4 shows an interconnect structure 400 in accordance with a second embodiment of the invention. A selective etch of ILD 30 is performed on the structure shown in FIG. 3. This results in the formation of trenches 38 between sidewall liners 31 of copper metallization levels 32. The trenches may have a depth in a range from about 50 nm to 500 nm. The trenches may have an aspect ratio (depth:width ratio) of about 2:1. Self-aligned dielectric cap 35 is used as an etch hard mask for the selective etch. ILD 30 may be carbon doped silicon oxide (SiCOH), porous SiCOH or silicon oxide (SiO). An ash etch may be performed for SiCOH. DHF may be performed for SiO. A non-conformal next level ILD deposition may be performed, resulting in air-gap shapes. Copper metallization level 32 is protected. The air-gap shapes may be formed using processes as described in commonly assigned U.S. Patent Publication No. US20090200636A1 entitled "Sub-lithographic Dimensioned Air Gap Formation and Related Structure" which is incorporated by reference herein in its entirety.

Figure 5:
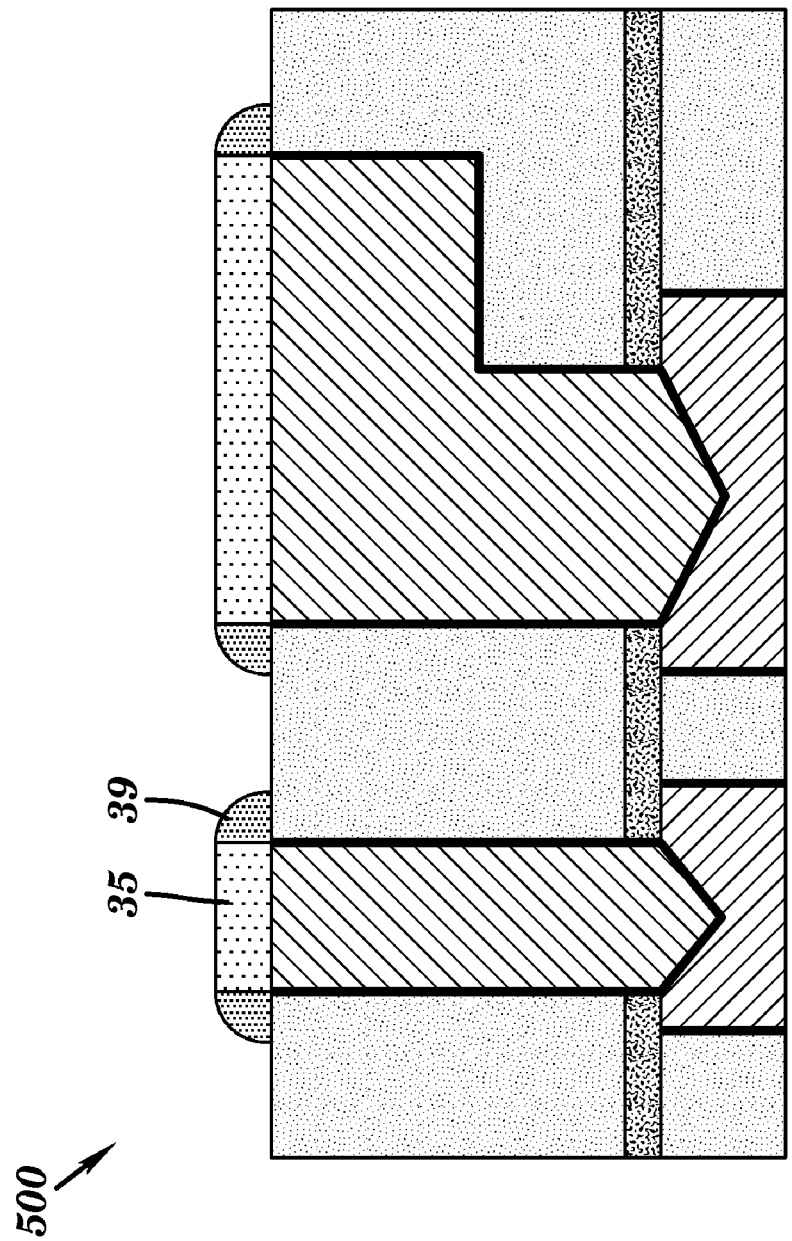
FIG. 5 shows a final interconnect structure in accordance with a third embodiment of the invention.

FIG. 5 shows an interconnect structure 500 in accordance with a third embodiment of the invention. A non-selective conformal dielectric material including, but not limited to silicon nitride (SiN) may be deposited and then subsequently etched back using conventional processes resulting in spacers 39. The spacer thickness (as deposited) may be greater than or equal to the thickness of sidewall liner 31. Spacers 39 provide protection for sidewall liner 31 during ILD etching.

Figure 6:
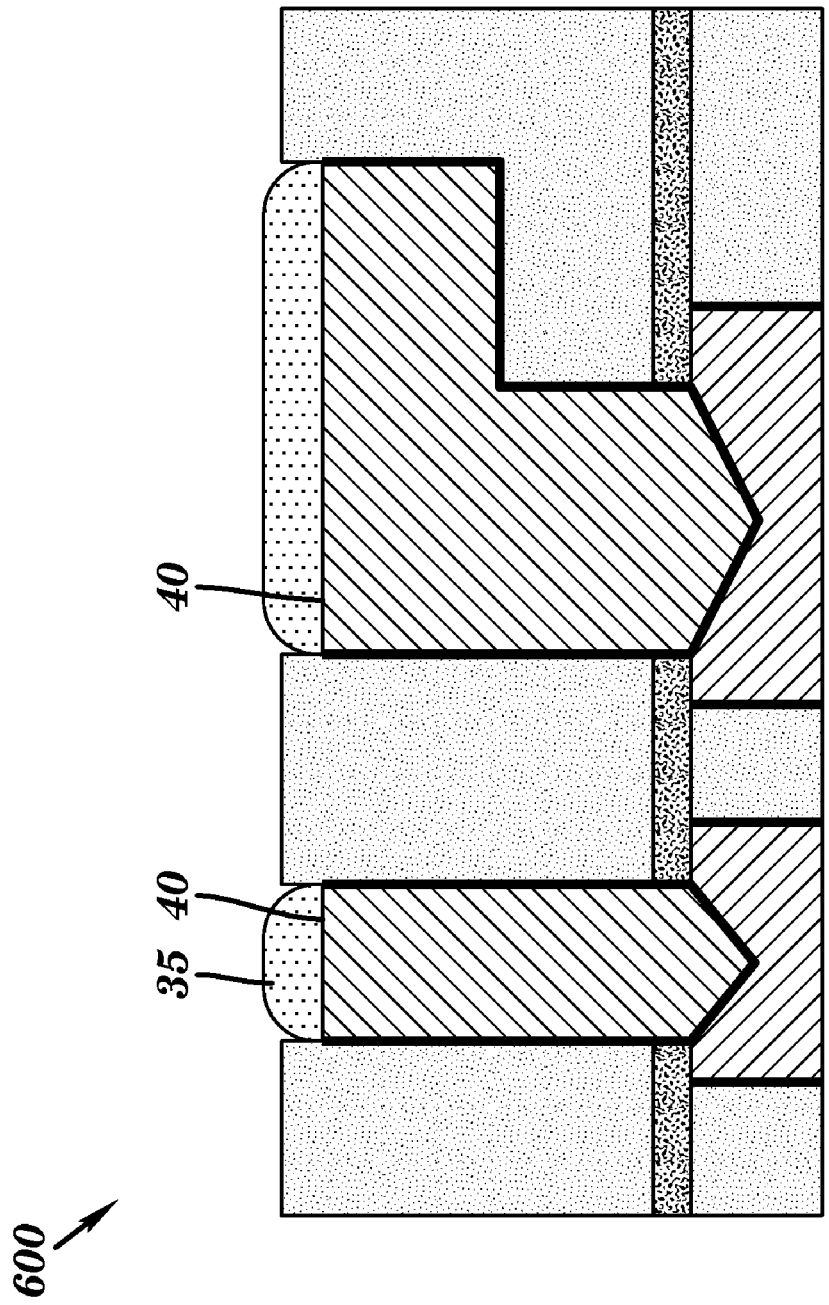
FIG. 6 shows a final interconnect structure in accordance with a fourth embodiment of the invention.

FIG. 6 shows an interconnect structure 600 in accordance with a fourth embodiment of the invention. A recess 40 may be formed in copper metallization level 32 before deposition of selective dielectric cap 35. Recess 40 may have a depth in a range from about 5 nm to 100 nm. Dielectric cap 35 may be approximately 5 nm to 100 nm thick. Recess 40 may be formed after the copper only CMP (as shown in FIG. 1). This results in uniform dielectric cap thickness across different line widths and provides increased interconnect reliability. The selective deposition of dielectric cap 35 may be followed by liner etch back (as shown in FIG. 3) using the same processes. The copper recess may be formed using processes as described in commonly assigned U.S. Pat. No. 6,975,032 entitled "Copper Recess Process with Application to Selective Capping and Electroless Plating" which is incorporated by reference herein in its entirety.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method of forming a device, comprising:
   providing a substrate;
   forming a first ILD layer above the substrate, wherein the first ILD layer has a top surface and a first opening;
   depositing a first metal liner in the first opening;
   forming a first metallization level in the first opening;
   forming a first cap layer on the top surface of the first ILD layer;
   forming a second ILD layer above the first cap layer, wherein the second ILD layer has a top surface and a second opening extending into the first metallization level;
   depositing a second metal liner on the top surface and in the second opening;
   forming a second metallization level in the second opening;
   performing a CMP of the second metallization level, wherein a top of the second metallization level is coplanar with a top of the second metal liner;
   forming a second cap layer on the second metallization level, wherein the forming of said second cap layer on the second metallization level comprises selectively depositing a dielectric cap selected from the group consisting of: silicon carbon nitride (SiCN), silicon nitride (SiN) and silicon carbide (SiC);
   forming a recess in the second metallization level below a top surface of the second ILD layer before the forming said second cap layer on the second metallization level; and
   removing the second metal liner from the top surface of the second ILD layer.

2. The method according to claim 1, wherein the dielectric cap is selectively deposited by one of chemical vapor deposition (CVD) and atomic layer deposition (ALD).

3. The method according to claim 1, wherein the removing the second metal liner from the top surface of the second ILD layer step comprises performing one of a carbon tetra fluoride (CF4) reactive ion etch (RIE) and a xenon fluoride (XeF) gas etch.

4. The method according to claim 1, wherein the second ILD layer is selected from the group consisting of: carbon doped silicon oxide (SiCOH), porous SiCOH and silicon oxide (SiO).

5. The method according to claim 1, wherein the second metal liner is one of a stack of tantalum nitride (TaN) and tantalum (Ta).

6. The method according to claim 1, wherein the second metallization level is copper.

7. The method according to claim 1, further comprising forming spacers adjacent to the second cap layer.

8. The method according to claim 1, further comprising forming at least one trench in the second ILD layer.

9. The method according to claim 8, wherein the forming at least one trench in the second ILD layer step comprises performing a selective etch of the second ILD layer.

10. A device, comprising:
    a substrate;
    a first ILD layer formed above the substrate, wherein the first ILD layer has a top surface and a first opening;
    a first metal liner deposited in the first opening;

a first metallization level formed in the first opening;

a first cap layer formed on the top surface of the first ILD layer;

a second ILD layer formed above the first cap layer, wherein the second ILD layer has a top surface and a second opening extending into the first metallization level;

a second metal liner deposited in the second opening;

a second metallization level formed in the second opening, wherein the second metallization level is recessed below the top surface of said second ILD layer; and a second cap layer formed on the second metallization level, wherein the second cap layer is selected from the group consisting of: silicon carbon nitride (SiCN), silicon nitride (SiN) and silicon carbide (SiC).

11. The device according to claim 10, wherein the second metallization level comprises copper.

12. The device according to claim 10, further comprising spacers formed adjacent to the second cap layer.

13. The device according to claim 10, further comprising at least one trench formed in the second ILD layer.

* * * * *